US 6,364,196 B1

(12) United States Patent
Wood et al.

(10) Patent No.: US 6,364,196 B1
(45) Date of Patent: Apr. 2, 2002

(54) METHOD AND APPARATUS FOR ALIGNING AND ATTACHING BALLS TO A SUBSTRATE

(75) Inventors: Alan G. Wood; Salman Akram, both of Boise; Mike Hess, Kuna; David R. Hembree, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/519,583

(22) Filed: Mar. 6, 2000

Related U.S. Application Data

(62) Division of application No. 09/143,631, filed on Aug. 28, 1998, now Pat. No. 6,100,175.

(51) Int. Cl.⁷ .......................... B23K 1/00; B23K 37/04; B23K 1/14
(52) U.S. Cl. .................. 228/41; 228/47.1; 228/49.1
(58) Field of Search ................. 228/180.22, 244, 228/245, 246, 6.1, 6.2, 41, 47.1, 49.1

(56) References Cited

U.S. PATENT DOCUMENTS

| 4,830,264 A | | 5/1989 | Bitaillou et al. | |
|---|---|---|---|---|
| 4,871,110 A | * | 10/1989 | Fukasawa et al. | 228/245 |
| 5,118,027 A | | 6/1992 | Braun et al. | |
| 5,299,730 A | | 4/1994 | Pasch et al. | |
| 5,346,775 A | | 9/1994 | Jin et al. | |
| 5,447,886 A | | 9/1995 | Rai | |
| 5,539,153 A | | 7/1996 | Schwiebert et al. | |
| 5,620,129 A | * | 4/1997 | Rogren | 228/56.3 |
| 5,620,927 A | | 4/1997 | Lee | |
| 5,643,831 A | | 7/1997 | Ochiai et al. | |
| 5,646,095 A | | 7/1997 | Eidelloth et al. | |
| 5,674,785 A | | 10/1997 | Akram et al. | |
| 5,679,267 A | | 10/1997 | Belcher et al. | |
| 5,739,585 A | | 4/1998 | Akram et al. | |
| 5,741,410 A | * | 4/1998 | Tsurushima | 204/297 M |
| 5,762,258 A | * | 6/1998 | Le Coz et al. | 228/56.3 |
| 5,803,339 A | * | 9/1998 | Hoshiba et al. | 228/41 |
| 5,816,482 A | | 10/1998 | Grabbe | |
| 5,839,641 A | * | 11/1998 | Teng | |
| 5,841,198 A | | 11/1998 | Chia | |
| 5,872,400 A | | 2/1999 | Chapman et al. | |
| 5,899,737 A | | 5/1999 | Trabucco | |
| 5,918,792 A | * | 7/1999 | Stumpe et al. | 228/41 |
| 5,986,348 A | | 11/1999 | Fukano | |
| 6,018,249 A | | 1/2000 | Akram et al. | |
| 6,040,702 A | | 3/2000 | Hembree et al. | |
| 6,072,326 A | | 6/2000 | Akram et al. | |
| 6,077,723 A | | 6/2000 | Farnworth et al. | |
| 6,095,398 A | * | 8/2000 | Takahashi et al. | 228/41 |

(List continued on next page.)

OTHER PUBLICATIONS

Studt, Tim, "Vacuum Process Cuts BGA Rework", R & D Magazine, May 1997, pp. 75–77.

*Primary Examiner*—Tom Dunn
*Assistant Examiner*—Zidia Pittman
(74) *Attorney, Agent, or Firm*—Stephen A. Gratton (57) ABSTRACT

A method for aligning and bonding balls to substrates, such as semiconductor wafers, dice and packages, is provided. The method employs a ball retaining plate having a pattern of micromachined cavities and vacuum conduits for retaining the balls. In addition, a substrate alignment member attached to the ball retaining plate, aligns the substrate to the balls. Using the substrate alignment member, bonding sites on the substrate can be placed in physical contact with the balls which are held by vacuum on the ball retaining plate. Next, the ball alignment plate and substrate can be place in a furnace for reflowing and bonding the balls to the bonding sites. An apparatus for performing the method includes the ball retaining plate and the substrate alignment member. A system for performing the method includes a ball loader mechanism for loading balls onto the ball retaining plate, and a vacuum fixture for applying a vacuum to the ball retaining cavities.

20 Claims, 4 Drawing Sheets

U.S. PATENT DOCUMENTS

| | | |
|---|---|---|
| 6,100,175 A | 8/2000 | Wood et al. |
| 6,107,109 A | 8/2000 | Akram et al. |
| 6,114,240 A | 9/2000 | Akram et al. |
| 6,118,179 A | 9/2000 | Farnworth et al. |
| 6,119,927 A * | 9/2000 | Ramos et al. ............... 228/254 |
| 6,150,717 A | 11/2000 | Wood et al. |
| 6,180,504 B1 | 1/2001 | Farnworth et al. |
| 6,186,392 B1 * | 2/2001 | Ball ........................... 228/245 |
| 6,208,157 B1 | 3/2001 | Akram et al. |
| 6,229,324 B1 | 5/2001 | Akram et al. |
| 6,283,358 B1 | 9/2001 | Ball |

* cited by examiner

METHOD AND APPARATUS FOR ALIGNING AND ATTACHING BALLS TO A SUBSTRATE

CROSS REFERENCE TO RELATED APPLICATIONS

This application is a division of application Ser. No. 09/143,631, filed on Aug. 28, 1998, now U.S. Pat. No. 6,100,175.

FIELD OF THE INVENTION

This invention relates generally to semiconductor manufacture, and more particularly to an improved method and apparatus for aligning and attaching balls to a substrate.

BACKGROUND OF THE INVENTION

Semiconductor components, such as wafers, dice and packages can include external contacts in the form of solder balls. For some components, such as chip scale packages, the balls can be arranged in a dense array, such as a ball grid array (BGA), or a fine ball grid array (FBGA). The balls provide a high input/output capability for a component, and permit the component to be surface mounted to a mating component such as a printed circuit board (PCB).

One conventional method for attaching the balls to a component substrate uses a solder reflow process. With this method the substrate can include bonding sites, such as bond pads, or land pads, on which layers of flux are deposited. A platen can be used to hold the substrate, while the flux is deposited on the bonding sites in a required pattern. After depositing the flux layers, the solder balls can be placed on the flux layers, and a convection furnace used to reflow the flux layers. After cooling, a permanent solder bond is formed between the bonding sites and solder balls.

Because the solder balls have a natural attraction for the flux layers, the alignment step is facilitated. However, one problem with this method is that during the heating step, the flux can liquefy prior to the balls. As the flux liquefies, the balls are free to move and can roll off the bonding site. This can cause missing and mis-aligned balls, and also defective components. Defects can lower throughput in a production process, and necessitate expensive rework procedures.

In order to maintain the balls in alignment with the bonding sites, a ball retaining plate is sometimes employed during the aligning and heating steps. For example, the ball retaining plate can include separate cavities for retaining each solder ball. A vacuum can also be applied to the cavities to provide a positive force for holding the balls in the cavities. U.S. Pat. No. 5,118,027 to Braun et al. discloses a reflow process in which a ball retaining plate and vacuum are used to hold the solder balls.

In general this method, and similar prior art methods, can be performed on balls that have a diameter of about 0.012-in (0.305 mm) or larger. A center to center pitch of the balls can be about 0.018-in (0.457) mm. However, as the balls become smaller, and the spacing between the balls become tighter, it becomes more difficult to align and attach the balls. Accordingly, there is a need in the art for an improved method and apparatus for aligning and attaching balls to substrates of semiconductor components.

Another problem with prior art aligning and attaching methods is the difficulty of fabricating ball retaining plates with the required feature sizes. For example, for fine ball grid array (FGBA) components, the balls can have a diameter as small as 0.005-in (0.127 mm), and a center to center pitch of only about 0.008-in (0.228 mm). It is difficult to make ball retaining plates with the required features sizes using conventional machining processes. Thus there is also a need in the art for improved methods for fabricating ball retaining plates and alignment systems that can accommodate smaller balls and tighter pitches.

SUMMARY OF THE INVENTION

In accordance with the present invention, an improved method, apparatus and system for aligning and attaching balls to a substrate are provided. The substrate can comprise a semiconductor component such as a wafer, a die, a chip scale package, or a separate substrate (e.g., BGA substrate) for a semiconductor component. In addition, the substrate can include bonding sites, such as bond pads or land pads, wherein the balls will be attached. Preferably, the balls comprise a eutectic solder material having a relatively low melting point. However, for some applications the balls can comprise a relatively hard metal, such as nickel, copper or beryllium copper.

To perform the method, a ball retaining plate having etched cavities for holding the balls is provided. Preferably the ball retaining plate comprises a material, such as silicon, ceramic, gallium arsenide, or photosensitive glass which can be micromachined with cavities in a dense array using an etching process. With an etching process, each cavity is forms as an etched pocket having sloped sidewalls configured to center and retain a ball. The size and shape of the cavities facilitates loading and retention of the balls on the ball retaining plate.

In addition to the cavities, the ball retaining plate includes vacuum conduits in flow communication with the cavities. The vacuum conduits are adapted for flow communication with a vacuum source for applying a vacuum to hold the balls in the cavities. The ball retaining plate can also include a substrate alignment member, configured to align bonding sites on the substrate to the balls held in the cavities. The substrate alignment member can comprise a separate member attached to the ball retaining plate, or a polymer deposited on the ball retaining plate. Further, the ball retaining plate can be constructed for mating engagement with a ball loader mechanism for loading the balls into the cavities, and a vacuum fixture for applying a vacuum to the cavities.

Initially, the balls are placed in the cavities of the ball retaining plate using the ball loader mechanism. During placement of the balls in the cavities, a vacuum can be applied to the cavities using the vacuum fixture. With the balls held in the cavities by vacuum, the substrate can be aligned with the ball retaining plate using the substrate alignment member. The aligned balls and bonding sites can then be placed in physical contact and the vacuum released. Next, the balls and bonding sites can be heated, such as by placement of the ball retaining plate in a convection furnace. Heating the balls and the bonding sites reflows the balls, and bonds the balls to the bonding sites. With the balls bonded, the ball retaining plate can be withdrawn from the substrate leaving the balls bonded to the substrate.

A system for performing the method includes the ball retaining plate having the micromachined cavities, and the substrate alignment member for aligning the substrate to the cavities. In addition, the system includes the ball loader mechanism for placing the balls in the cavities, and the vacuum fixture for applying a vacuum to the balls held in the cavities. The system also includes a furnace for heating the balls and bonding sites. Preferably the furnace comprises a controlled atmosphere vacuum furnace which is purged of oxygen.

A method for fabricating the ball retaining plate can be performed using a wafer of material. Initially, a laser machining process can be used to form the vacuum conduits in the wafer. A hard mask can then be formed on the wafer with a pattern of openings sized and shaped to form the cavities in flow communication with the vacuum conduits. Using a wet etchant (e.g., KOH or TMAH for a silicon wafer) the wafer can be etched through openings in the hard mask to form the cavities. At the same time the cavities are etched, the laser machined vacuum conduits can also be etched. Next, the hard mask can be stripped, and the wafer sawed to form multiple ball retaining plates each having a required peripheral configuration.

DETAILED DESCRIPTION OF THE PREFERRED EMBODIMENTS

Referring to FIGS. 1A–1D, 2, and 3, various prior art semiconductor substrates having external balls 10 are illustrated. The method of the invention, which will be hereinafter described, can be used to attach the balls 10 to the substrate.

Figure 1A:
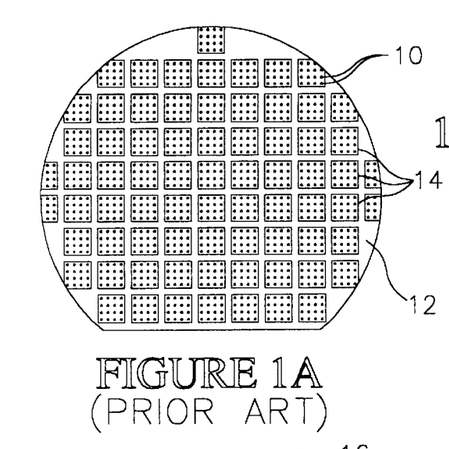
FIG. 1A is a plan view of a prior art bumped semiconductor wafer.
Figure 1B:
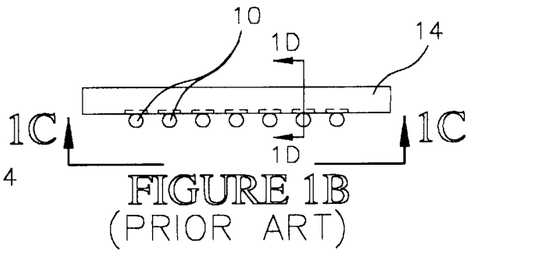
FIG. 1B is an enlarged side elevation view of a bumped die which has been separated from the wafer.

In FIG. 1A the substrate is a semiconductor wafer 12 comprising a plurality of semiconductor dice 14. FIG. 1B illustrates a die 14 that has been separated from the wafer 12. Each die 14 includes a plurality of balls 10 which can be attached to the die 14 using the method of the invention. The method of the invention can be performed on the wafer 12 prior to singulation of the individual dice 14. Alternately the method of the invention can be performed on singulated dice 14.

Figure 1C:
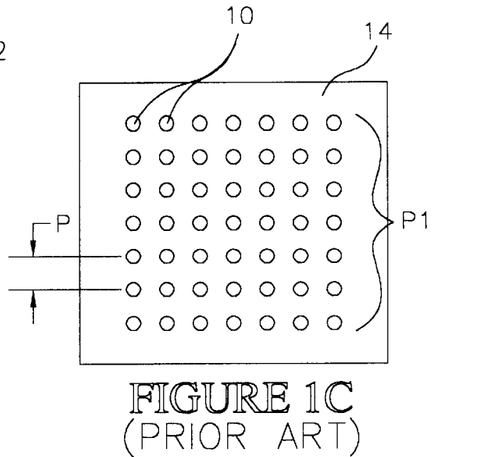
FIG. 1C is a bottom view of the die taken along section line 1C—1C of FIG. 1B.

As shown in FIG. 1C, the balls 10 are formed on the die 14 in a pattern P1. In the illustrative embodiment the pattern P1 is a dense grid array, such as a ball grid array (BGA). By way of example, a representative diameter D1 for the balls 10 can be about 0.005-in (0.127 mm) to 0.050-in (1.270 mm) or greater. A representative pitch P (center to center spacing) of the balls 10 can be from about 0.008-in (0.228 mm) to about 0.060-in (1.524 mm) or greater.

Figure 1D:
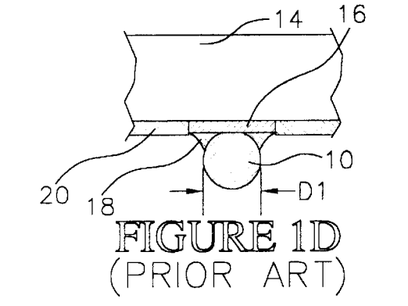
FIG. 1D is an enlarged cross sectional view taken along section line 1D—1D of FIG. 1B showing a ball bonded to a bonding site on the die.

Prior to performing the method of the invention, the die 14 can be provided with a plurality of bonding sites 16. FIG. 1D illustrates one example for a bonding site 16 in the form of a thin film aluminum bond pad embedded in a passivation layer 20. FIG. 1D also illustrates a single ball 10 that has been bonded to the bonding site 16 on the die 14 using a solder flux 18.

Figure 2:
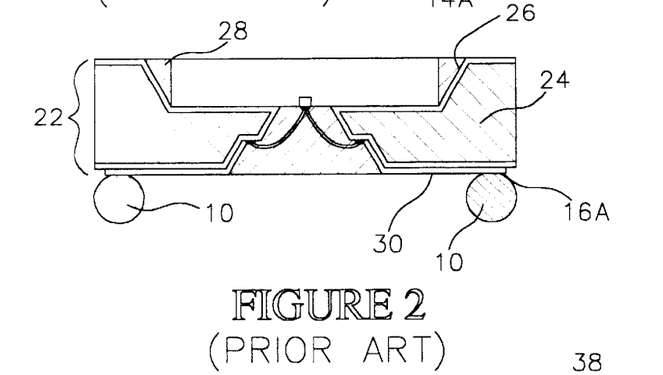
FIG. 2 is an enlarged cross sectional view of a prior art chip scale package having balls.

FIG. 2 illustrates another prior art substrate in the form of a chip scale package 22. The chip scale package 22 includes a silicon body 24 having a recess 26 wherein a semiconductor die 14A is held by an encapsulant 28. The package 22 also includes conductors 30 wire bonded to the die 14A. The conductors 30 include bonding sites 16A for the balls 10. Further details of the chip scale package 22 are described in U.S. Pat. No. 5,674,785 to Akram et al. entitled "Method Of Producing A Single Piece Package For Semiconductor Die", and in U.S. Pat. No. 5,739,585, entitled "Single Piece Package For Semiconductor Die", both of which are incorporated herein by reference.

Figure 3:
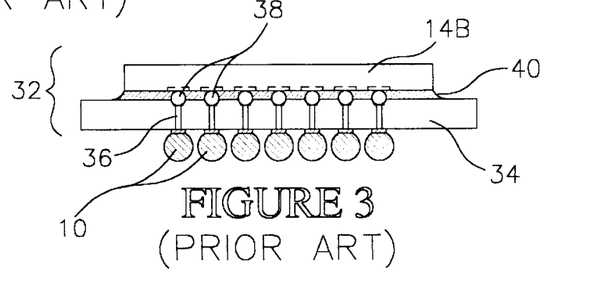
FIG. 3 is an enlarged cross sectional view of another prior art chip scale package having balls on a separate substrate.

FIG. 3 illustrates another prior art substrate in the form of a chip scale package 32. The chip scale package 32 includes a die 14B and a BGA substrate 34. The BGA substrate 34 includes balls 10 in electrical communication with internal conductors 36 in the substrate 34. In addition, an adhesive layer 40 attaches the BGA substrate 34 to the die 14B, with the internal conductors 36 on the BGA substrate 34 in electrical communication with bumps 38 on the die 14B. The BGA substrate 34 can be formed separately, and the balls 10 attached using the method of the invention prior to attachment of the die 14B. Alternately the balls 10 can be attached to the BGA substrate 34 after attachment of the die 14B.

Figure 4A:
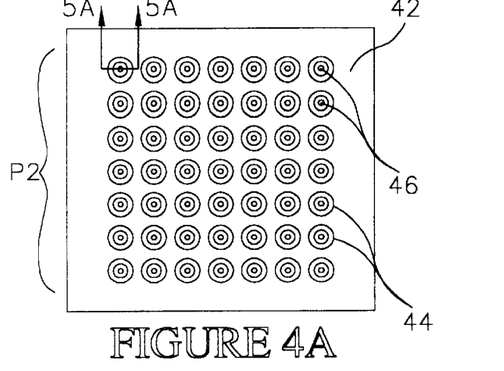
FIG. 4A is a plan view of a ball retaining plate constructed in accordance with the invention.
Figure 4B:
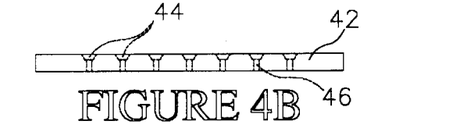
FIG. 4B is a side elevation view of the ball retaining plate of FIG. 4A.

Referring to FIGS. 4A and 4B, a ball retaining plate 42 constructed in accordance with the invention is illustrated. In the embodiment illustrated in FIGS. 4A and 4B, the ball retaining plate 42 is configured to align and attach balls 10 to the singulated die 14. Alternately, a ball retaining plate 42W (FIG. 7) can be configured to align and attach balls 10 to the wafer 12 (FIG. 1A). Still further, a ball retaining plate 42CSP (FIG. 9) can be configured to align and attach balls 10 to multiple chip scale packages 22 (FIG. 2) at the same time.

As shown in FIG. 4A, the ball retaining plate 42 includes a plurality of ball retaining cavities 44. The ball retaining plate 42 also includes a plurality of vacuum conduits 46 in flow communication with the ball retaining cavities 44. The ball retaining cavities 44 are formed on the ball retaining plate 42 in a pattern P2 that matches the pattern P1 (FIG. 1C) of the bonding sites 16 on the die 14. In addition, a peripheral outline of the ball retaining plate 42 matches, but is slightly larger than, a peripheral outline of the die 14.

Figure 5A:
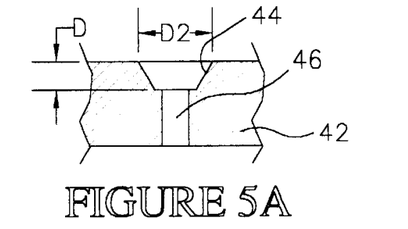
FIG. 5A is an enlarged cross sectional view taken along section line 5A—5A of FIG. 4A illustrating a ball retaining cavity of the ball retaining plate.

As shown in FIG. 5A, each ball retaining cavity 44 has sloped sidewalls which can be formed using an anisotropic etch process. The sloped sidewalls help to guide the balls 10 into the ball retaining cavities 44. As also shown in FIG. 5A, a diameter D2 of each ball retaining cavity 44 is approximately equal to, but slightly greater than the diameter D1 of the balls 10 (e.g., D2 is from one to several mils greater than D1). A depth D of each ball retaining cavity 44 is preferably less than the diameter D1 of the balls 10 (e.g., D is from about 25% to 75% of D1).

Figure 5B:
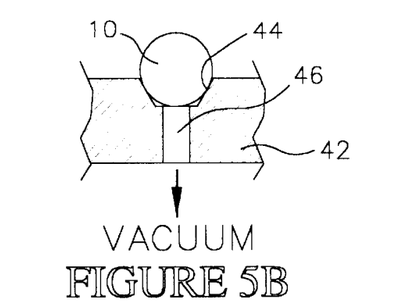
FIG. 5B is an enlarged cross sectional view illustrating the ball retaining cavity retaining a ball.

As shown in FIG. 5B, with the diameter D2 of the ball retaining cavities 44 being greater than the diameter D1 of the balls 10, and the depth D of the ball retaining cavities 44 being less that the diameter D1 of the balls 10, the balls 10 can be retained in the cavities 44 while projecting from a surface 48 of the ball retaining plate 42.

Figure 6A:
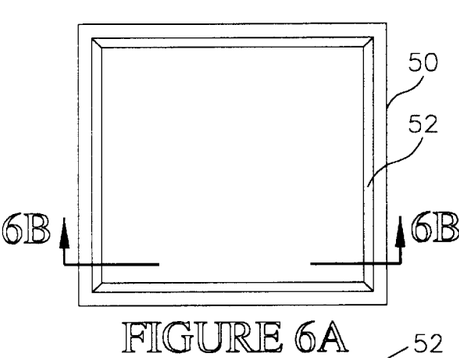
FIG. 6A is a plan view of a substrate alignment member configured to align a substrate, such as a die or chip scale package, with the ball retaining plate.
Figure 6B:
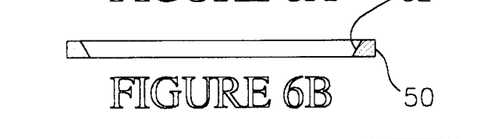
FIG. 6B is a cross sectional view of the substrate alignment member taken along section line 6B—6B of FIG. 6A.

Referring to FIG. 6A, a substrate alignment member 50 configured to align the die 14 to the ball retaining plate 42 is illustrated. In the embodiment illustrated in FIG. 6A, the substrate alignment member 50 is fabricated separately and then attached to the ball retaining plate 42. Preferably the substrate alignment member 50 comprises a same material as the ball retaining plate 42 (e.g., silicon, ceramic photosensitive glass). Alternately, as will be hereinafter described, the substrate alignment member 50 can comprise a polymer material which is deposited on the ball retaining plate 42.

The substrate alignment member 50 includes an alignment opening 52 configured to engage the peripheral edges of the die 14. The alignment opening 52 includes sloped sidewalls which can be formed using an anisotropic etch process to be hereinafter described. The sloped sidewalls of the alignment opening 52 help to guide and center the die 14 on the ball retaining plate 42.

Figure 7:
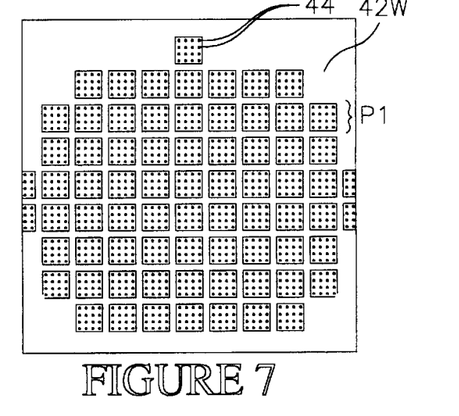
FIG. 7 is a plan view of an alternate embodiment ball retaining plate configured to align and attach balls to a substrate, such as a wafer.

Referring to FIG. 7, an alternate embodiment ball retaining plate 42W is configured to align and attach balls 10 to the wafer 12. In this embodiment, the ball retaining plate 42W includes a plurality of separate patterns of ball retaining cavities 44 corresponding to the bonding sites 16 (FIG. 1D) on the dice 14 contained on the wafer 12.

Figures 8A, 8B:
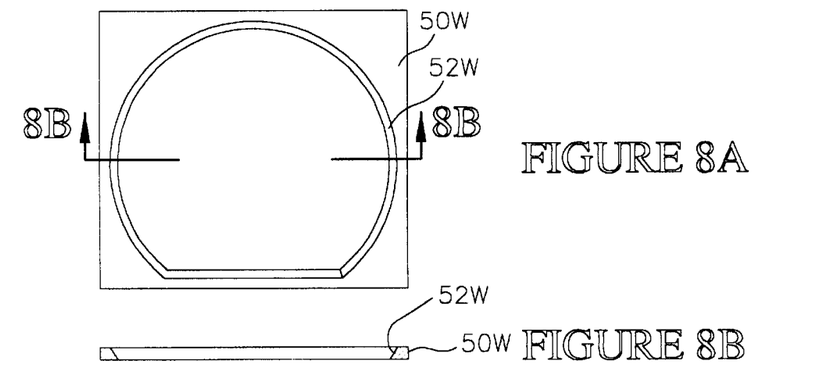
FIG. 8A is a plan view of a substrate alignment member configured to align the wafer to the ball retaining plate of FIG. 7.
FIG. 8B is a cross sectional view of the substrate alignment member taken along section line 8B—8B of FIG. 8A.

FIGS. 8A and 8B illustrate an alternate embodiment substrate alignment member 50W configured to align the wafer 12 to the ball retaining plate 42W (FIG. 7). The substrate alignment member 50W includes an alignment opening 52W having a peripheral outline corresponding to the wafer 12. As before, the sidewalls of the alignment opening 52W can be sloped using an anisotropic etch process to be hereinafter described.

Figure 9:
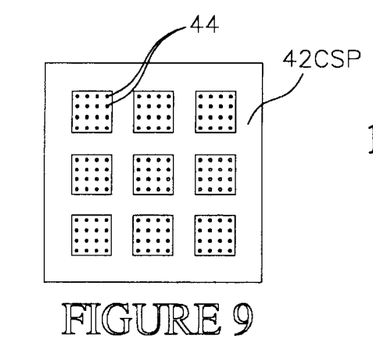
FIG. 9 is a plan view of an alternate embodiment ball retaining plate configured to align and attach balls to multiple substrates at a same time.

Referring to FIG. 9, an alternate embodiment ball retaining plate 42CSP is configured to align and attach balls 10 to multiple chip scale packages 22 (or other similarly shaped substrates). In this embodiment, the ball retaining plate 42CSP includes a plurality of separate patterns of ball retaining cavities 44 corresponding to the patterns of bonding sites 16 on nine separate chip scale packages 22. As is apparent, the nine patterns of ball retaining cavities 44 are merely exemplary, as any number of cavities from one or more can be employed.

Figure 10A:
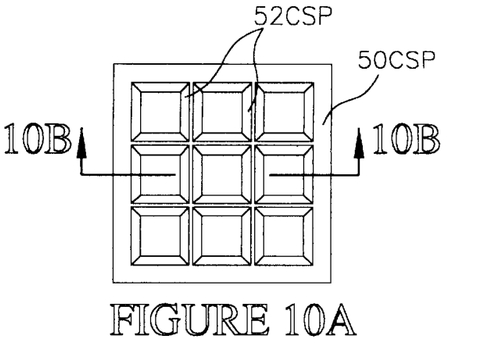
FIG. 10A is a plan view of an alternate embodiment substrate alignment member configured to align multiple substrates to the ball retaining plate of FIG. 9.
Figure 10B:
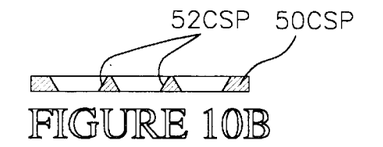
FIG. 10B is a cross sectional view taken along section line 10B—10B of FIG. 10A.

FIGS. 10A and 10B illustrate an alternate embodiment substrate alignment member 50CSP configured to align nine separate chip scale packages 22 to the ball retaining plate 42CSP (FIG. 9). The substrate alignment member 50CSP includes nine alignment openings 52CSP having peripheral outlines corresponding to the chip scale packages 22. As before, the sidewalls of the alignment openings 52CSP can be sloped using an anisotropic etch process to be hereinafter described.

Figure 11A:
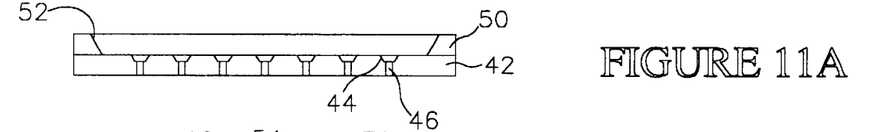
FIG. 11A is a schematic cross sectional view of the ball retaining plate and the substrate alignment member.

Referring to FIGS. 11A–11E steps in the method of the invention are illustrated. Initially, as shown in FIG. 11A, the ball retaining plate 42 and substrate alignment member 50 are provided. The ball retaining plate 42 includes the ball retaining cavities 44 and the vacuum conduits 46. The substrate alignment member 50 includes an alignment opening 52. Also, the substrate alignment member 50 has been attached to the ball retaining plate 42, using an adhesive, such as silicone. In addition, the ball retaining plate 42 and the substrate alignment member 50 preferably comprise a same material so that thermal expansion with temperature changes is the same. Also, if the ball retaining plate 42 and the substrate alignment member 50 both comprise silicon, a coefficient of thermal expansion (CTE) of the assembly will exactly match a CTE of a silicon substrate.

Figure 11B:
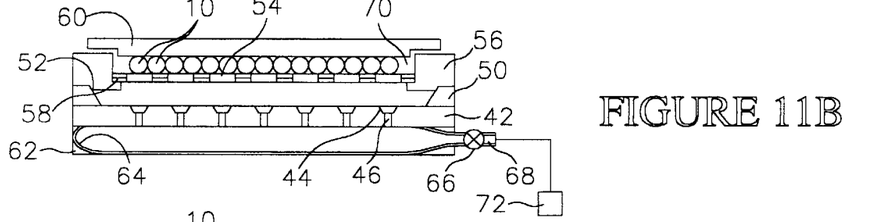
FIG. 11B is a schematic cross sectional view of a ball loader mechanism and vacuum fixture attached to the ball retaining plate and the substrate alignment member.

Next, as shown in FIG. 11B, a ball loader mechanism 56 is attached to the substrate alignment member 50, and a vacuum fixture 62 is attached to the ball retaining plate 42. The ball loader mechanism 56 includes a reservoir 70 containing a supply of balls 10. In addition, the ball loader mechanism 56 includes a squeegee 60 configured to press balls 10 from the reservoir 70 through openings 54 in a screen 58 onto the ball retaining plate 42.

The vacuum fixture 62 is configured to apply a vacuum through the vacuum conduits 46 to the ball retaining cavities 44. The vacuum fixture 62 includes a valve 66 and a connector 68 configured for connection to a vacuum source 72. In addition, the vacuum fixture 62 includes a sealed bladder 64 that permits the vacuum to be preserved without the vacuum source 72, once the balls 10 have been seated in the ball retaining cavities 44.

Still referring to FIG. 11B, using the ball loader mechanism 56 the balls 10 can be pressed by the squeegee 60 through the screen 58 into the ball retaining cavities 44. During this process, a vacuum can be generated in the vacuum conduits 46 for attracting and maintaining the balls 10 in the ball retaining cavities 44.

Figure 11C:
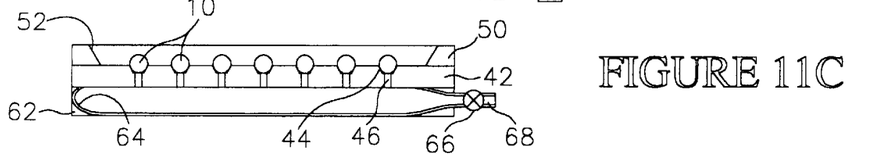
FIG. 11C is a schematic cross sectional view of the ball retaining plate and the substrate alignment member with balls loaded into the ball retaining cavities.

FIG. 11C illustrates the balls 10 seated within the ball retaining cavities 44 and the ball loader mechanism 56 removed. Excess balls 10 can also be removed from the ball retaining plate 42 using a brush or other suitable tool. In addition, the connector 68 can be disconnected from the vacuum source 72, and the valve 66 closed to preserve the vacuum within the bladder 64.

Figure 11D:
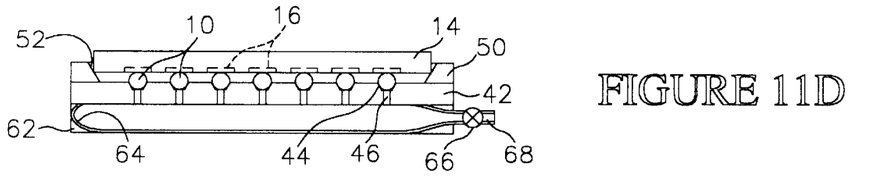
FIG. 11D is a schematic cross sectional view illustrating a substrate on the substrate alignment member having bonding sites in physical contact with balls on the ball retaining plate.

Next, as shown in FIG. 11D, the die 14 can be placed in the alignment opening 52 of the substrate alignment member 50. A pick and place mechanism, or a vacuum tool, can be used to place the die 14 in the alignment opening 52. The alignment opening 52 aligns the die 14, such that the bonding sites 16 on the die 14 align with and physically contact the balls 10 held in the ball retaining cavities 44.

Figure 11E:
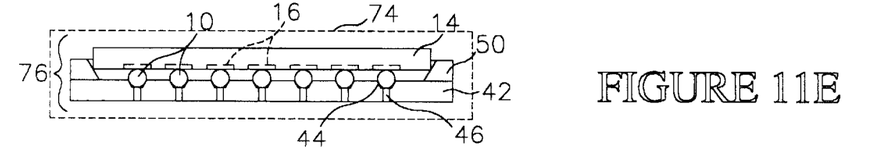
FIG. 11E is a schematic cross sectional view of the assembly of FIG. 9 placed in a furnace during reflow and bonding of the balls to the substrate.

Next, as shown in FIG. 1E, the vacuum fixture 62 can be removed and an assembly 76 comprising the die 14, the substrate alignment member 50 and the ball retaining plate 42 can be placed in a furnace 74. Optionally, the vacuum fixture 62 can remain attached to the ball retaining plate 42 and the vacuum preserved during placement of the assembly 76 in the furnace 74.

Figure 12:
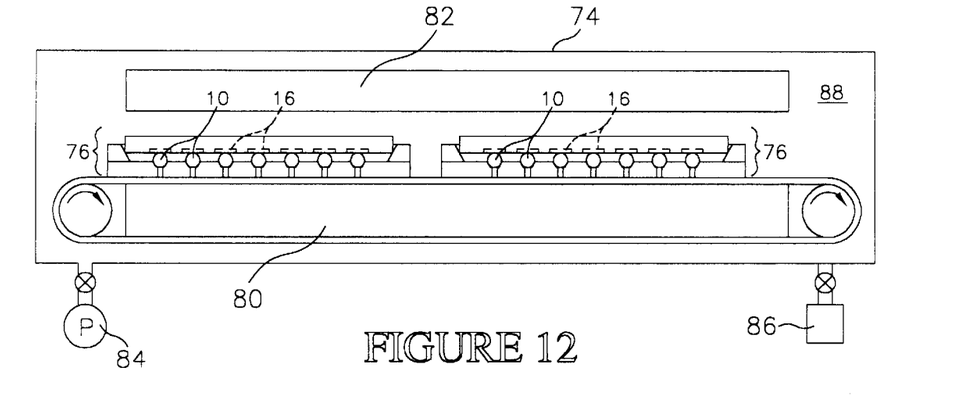
FIG. 12 is a schematic view of the furnace.

Referring to FIG. 12, the furnace 74 is illustrated. The furnace 74 includes a conveyor 80 for moving the assemblies 76 through the furnace 74 at a desired speed. In addition, the furnace 74 includes a heat source 82 for heating the balls 10 and bonding sites 16 to a temperature that is above the melting point of the balls 10. This reflows and bonds the balls 10 to the bonding sites 16. If desired, the bonding sites 16 can include a non-oxidizing solder wettable layer, such as gold, platinum or palladium, which will facilitate the bonding process.

The melting point of the balls 10 will be dependent on the solder. Suitable solder alloys include 95%Pb/5%Sn, 60%Pb/40%Sn, 63%Sn/37%Pb, or 62%Pb/36%Sn/2%Ag. Depending on their composition these Pb/Sn solders will have a melting point of from about 150° C. to about 200° C.

For some applications the balls 10 can comprise a relatively hard wear resistant metal such as nickel, copper, beryllium copper, alloys of nickel, alloys of copper, alloys of beryllium copper, nickel-cobalt-iron alloys, and iron-nickel alloys. However, these metals are limited to applications wherein the high temperatures required to reflow the balls 10 will not be detrimental to integrated circuits and electrical elements contained on the substrate. For example, the BGA substrate 34 (FIG. 3) does not include integrated circuits, and could be heated to temperatures high enough to reflow balls 10 formed of the above metals.

Also, for some applications a solder flux can be applied to either the balls 10 or to the bonding sites 16. In this case, heating can be to a temperature high enough to melt the solder flux. The solder flux then bonds the balls 10 to the bonding sites 16. Layers of solder flux can be applied to the balls 10 or to the bonding sites 16 by screen printing or other suitable deposition process.

In addition to the conveyor 80 and heat source 82, the furnace 74 can include a sealed process chamber 88 in flow communication with a vacuum pump 84, and an inert gas supply 86. Such an arrangement can be used to purge the chamber 88 of oxygen, which inhibits formation of oxide layers, and facilitates formation of a bond between the balls 10 and bonding sites 16. A representative vacuum pressure in the process chamber 88 can be from about $10^{-1}$ to $10^{-3}$ torr. This type of furnace 74 with a sealed process chamber 88 is commercially available from Scientific Sealing Technology (SST) of Downey, Calif.

Referring to FIGS. 13A–13D, process steps suitable for fabricating the ball retaining plate 42 are illustrated. Initially, a wafer blank 90 can be provided. Suitable materials for the wafer blank 90 include monocrystalline silicon, ceramic, photosensitive glass and gallium arsenide. A representative thickness for the wafer blank 90 can be from 0.012-in (0.305 mm) to 0.120-in (3.05 mm) or greater.

The wafer blank 90 can be large enough to fabricate a plurality of ball retaining plates 42 using a wafer level fabrication process. For simplicity in FIGS. 13A–13D, only a single ball retaining plate 42 is illustrated. Also, the fabrication steps for the alternate embodiment ball retaining plates 42W (FIG. 7) and 42CSP (FIG. 9) will be substantially the same as illustrated in FIGS. 13A–13D for ball retaining plate 42.

Figure 13A:
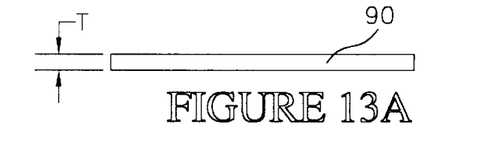
FIGS. 13A–13D are schematic cross sectional views illustrating steps in a method for fabricating the ball retaining plate.
Figures 13B, 13C, 15B, 15C:
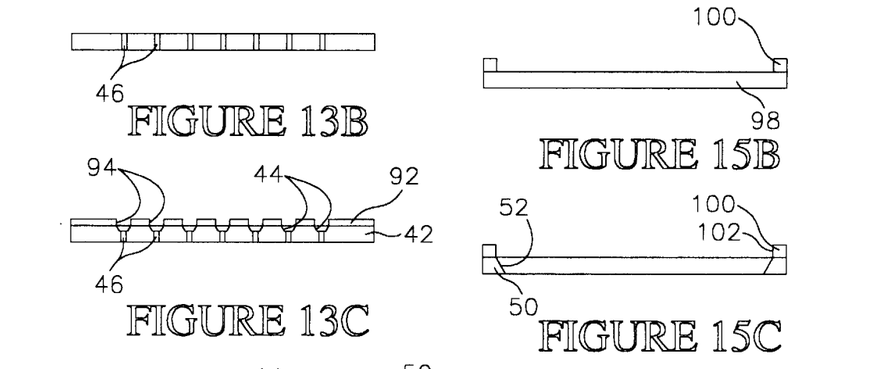
FIGS. 15A–15D are schematic cross sectional views illustrating steps in a method for fabricating the substrate alignment member.

Next, as shown in FIG. 13B the vacuum conduits 46 can be formed in the wafer blank 90 using a suitable process. One method for forming the vacuum conduits 46 is with a laser machining process. A suitable laser machining apparatus is manufactured by General Scanning of Sommerville, Mass and is designated a model no. 670-W. A representative diameter of the vacuum conduits 46 can be from 10 μm to 2 mils or greater. A representative laser fluence for forming the vacuum conduits 46 through a wafer blank 90 comprising silicon and having a thickness of about 0.028-in (0.711 mm) is from 2 to 10 watts/per opening at a pulse duration of 20–25 ns and at a repetition rate of up to several thousand per second. The wavelength of the laser beam can be a standard infrared or green wavelength (e.g., 1064 nm–532 nm).

Next, as shown in FIG. 13C, an etch mask 92 can be formed on the wafer blank 90 and used to etch the ball retaining cavities 44. The etch mask 92 can comprise resist, or a hard mask such as $Si_3N_4$. In addition, a wet etchant can be used to anisotropically etch the wafer blank 90 to form the ball retaining cavities 44. If an anisotropic etch procedure is employed, the ball retaining cavities 44 will form as pockets with sloped sidewalls and a decreasing radius. The etched shape of the ball retaining cavities 44 aids in loading the balls 10 into the cavities 44 and in retaining the balls 10 following loading. Such an anisotropic wet etch procedure is sometimes referred to in the art as bulk micro machining.

Selection of the wet etchant will depend on the material selected for the wafer blank 90. With the wafer blank 90 comprising silicon, a suitable wet etchant comprises potassium hydroxide (KOH), or alternately a solution of tetramethyl ammonium hydroxide (TMAH). With the wafer blank 90 comprising a ceramic material, a suitable wet etchant comprises a solution of HF. An ion milling process can also be used to etch a wafer blank 90 comprising a ceramic material. With the wafer blank comprising gallium arsenide a suitable wet etchant comprises bromine in methanol ($Br_2$—$CH_3OH$). With the wafer 90 blank comprising a photosensitive glass a suitable wet etchant comprises HF. In addition, photosensitive glasses and etchants are commercially available from Dow Corning under the trademark "FOTOFORM".

Figure 14A:
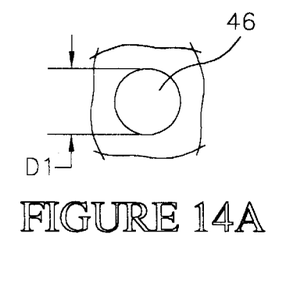
FIG. 14A is a cross sectional view taken along section line 14A of FIG. 13B illustrating a laser machined vacuum conduit in the ball retaining plate.
Figure 14B:
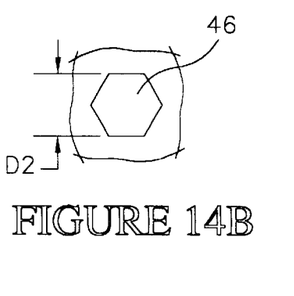
FIG. 14B is a cross sectional view taken along section line 14B of FIG. 13C illustrating the laser machined vacuum conduit following etching.

The diameter D2 (FIG. 5A) and depth D (FIG. 5A) of the ball retaining cavities 44 will be dependent on the size of etch openings 94 in the etch mask 92 and on the etch parameters. At the same time that the ball retaining cavities 44 are etched, the previously machined vacuum conduits 46 can also be etched. As shown in FIG. 14A, vacuum conduits 46 formed by laser machining will initially be circular in cross section. As shown in FIG. 14B, following an anisotropic wet etch with a silicon wafer blank 90, the vacuum conduits will have a multi faceted cross section (e.g., six sided).

Following the etch procedure, the etch mask 92 can be stripped using a suitable wet chemical. For an etch mask 92 comprising $Si_3N_4$ one suitable wet chemical for stripping the mask 92 comprises $H_3PO_4$.

Figure 13D:
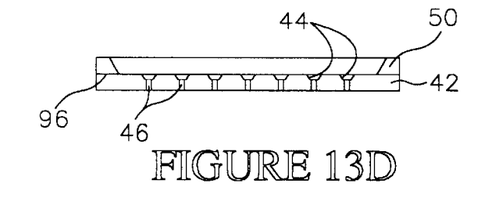

Next, as shown in FIG. 13D, the substrate alignment member 50 can be attached to the ball retaining plate 42. One method of attachment is by forming an adhesive layer 96 out of silicone or other polymeric material.

As an alternative to attaching the separately formed substrate alignment member 50, a deposited polymer can be used to form the substrate alignment member 50 directly on the ball retaining plate 42. One suitable polymer comprises a thick film resist sold by Shell Chemical under the trademark "EPON RESIN SU-8". The resist includes an organic solvent (e.g., gamma-butyloracton), and a photoinitiator. A conventional resist coating apparatus, such as a spin coater, or a meniscus coater, along with a mask or stencil, can be used to deposit the resist in viscous form onto the ball retaining plate 42. The deposited resist can then be partially hardened by heating to about 95° C. for about 15 minutes or longer. Following partial hardening, the resist can be developed and etched to form the alignment opening 52, and then fully hardened by heating to about 95° C. for about an hour.

Figure 15A:
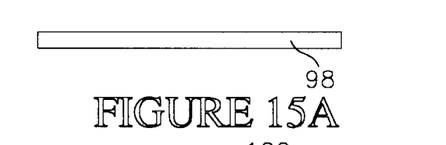

Referring to FIGS. 15A–15D, steps in a method for fabricating the substrate alignment member 50 are illustrated. Initially, as shown in FIG. 15A, a wafer blank 98 can be provided as previously described for wafer blank 90 (FIG. 13A).

Next, as shown in FIG. 15B, an etch mask 100 with an etch opening 102, can be formed on the wafer blank 98. The etch mask 100 can be formed as previously described for etch mask 92 (FIG. 13C).

Next, as shown in FIG. 15C, the alignment opening 52 can be formed using a wet etch process as previously described for the ball retaining cavities 44 (FIG. 13C).

Figure 15D:
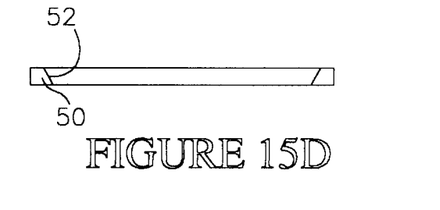

Next, as shown in FIG. 15D, the etch mask 100 can be stripped as previously described for etch mask 92.

Thus the invention provides an improved method, apparatus and system for aligning and attaching balls to a substrate. Although the invention has been described with reference to certain preferred embodiments, as will be apparent to those skilled in the art, certain changes and modifications can be made without departing from the scope of the invention, as defined by the following claims.

We claim:

1. An apparatus for aligning and bonding balls to bonding sites on a substrate comprising:

a ball retaining member comprising a plurality of ball retaining cavities configured to center and to retain the balls on the bonding sites; and an alignment member on the ball retaining member configured to align the substrate on the ball retaining member with the bonding sites in physical contact with the balls.

2. The apparatus of claim 1 wherein the ball retaining member comprises a material selected from the group consisting of silicon, ceramic, gallium arsenide, and glass.

3. The apparatus of claim 1 wherein the alignment member comprises a material selected from the group consisting of silicon, ceramic, gallium arsenide, and glass.

4. The apparatus of claim 1 wherein the alignment member comprises a polymer deposited on the ball retaining member.

5. An apparatus for aligning and bonding balls to bonding sites on a substrate comprising:

a ball retaining plate comprising a plurality of ball retaining cavities and a plurality of vacuum conduits in flow communication with the cavities, each ball retaining cavity comprising a pocket with sloped sidewalls configured to center and to retain a ball; and an alignment member on the ball retaining plate comprising an alignment opening configured to align the substrate on the ball retaining plate such that the balls retained in the ball retaining cavities align with the bonding sites on the substrate.

6. The apparatus of claim 5 wherein the ball retaining plate and the alignment member both comprise silicon.

7. The apparatus of claim 5 wherein the alignment member comprises a separate element attached to the ball retaining plate.

8. The apparatus of claim 5 wherein the alignment member comprises a polymer.

9. An apparatus for aligning and bonding balls to bonding sites on a substrate comprising:

a ball retaining plate having a plurality of ball retaining cavities therein, and a plurality of vacuum conduits in flow communication with the ball retaining cavities; and an alignment member on the ball retaining plate comprising at least one alignment opening configured to engage a peripheral edge of the substrate to align the substrate on the ball retaining plate with the bonding sites in physical contact with the balls.

10. The apparatus of claim 9 wherein the alignment member comprises a plurality of alignment openings configured to align a plurality of substrates.

11. The apparatus of claim 9 wherein the alignment opening has a peripheral outline corresponding to the peripheral edge of the substrate.

12. An apparatus for aligning and bonding balls to bonding sites on a substrate comprising:

a ball retaining plate comprising a plurality of ball retaining cavities, and a plurality of vacuum conduits in flow communication with the ball retaining cavities; and an alignment member comprising a polymer deposited on the ball retaining plate having an alignment opening configured to engage a peripheral edge of the substrate to align the substrate on the ball retaining plate with the balls and the bonding sites in physical contact.

13. The apparatus of claim 12 wherein the polymer comprises a resist.

14. An apparatus for aligning and bonding balls to bonding sites on a substrate comprising:

a ball retaining plate comprising a plurality of ball retaining cavities, and a plurality of vacuum conduits in flow communication with the cavities, each ball retaining cavity comprising a pocket in the ball retaining plate having sloped sidewalls configured to engage and center a ball on a bonding site, each vacuum conduit comprising an opening in the ball retaining plate configured for flow communication with a vacuum source; and an alignment member attached to the ball retaining plate having an alignment opening therein with an outline corresponding to a peripheral edge of the substrate configured to engage the peripheral edge and to align the balls on the ball retaining plate with the bonding sites on the substrate.

15. The apparatus of claim 14 wherein the substrate comprises an element selected from the group consisting of semiconductor wafers, semiconductor dice, semiconductor packages, and ball grid array substrates.

16. The apparatus of claim 14 wherein the alignment opening has sloped sidewalls.

17. The apparatus of claim 14 wherein the ball retaining plate and the alignment member both comprise silicon.

18. The apparatus of claim 14 wherein the ball retaining plate comprises a material selected from the group consisting of silicon, ceramic, gallium arsenide, and glass.

19. The apparatus of claim 14 wherein the alignment member comprises a material selected from the group consisting of silicon, ceramic, gallium arsenide, and glass.

20. The apparatus of claim 14 wherein the ball retaining plate comprises silicon and the substrate alignment member comprises a polymer.

* * * * *